United States Patent
Park et al.

(10) Patent No.: US 8,058,783 B2
(45) Date of Patent: Nov. 15, 2011

(54) ORGANIC LIGHT EMITTING DIODE DISPLAY FOR SUPPRESSING REFLECTION OF EXTERNAL LIGHT

(75) Inventors: Soon-Ryong Park, Yongin-si (KR);
Hee-Seong Jeong, Yongin-si (KR);
Woo-Suk Jung, Yongin-si (KR);
Noh-Min Kwak, Yongin-si (KR);
Chul-Woo Jeong, Yongin-si (KR);
Eun-Ah Kim, Yongin-si (KR);
Hee-Chul Jeon, Yongin-si (KR);
Joo-Hwa Lee, Yongin-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 180 days.

(21) Appl. No.: 12/508,426

(22) Filed: Jul. 23, 2009

(65) Prior Publication Data

US 2010/0019667 A1    Jan. 28, 2010

Related U.S. Application Data (60) Provisional application No. 61/083,866, filed on Jul. 25, 2008.

(51) Int. Cl.
*H01J 5/16* (2006.01)
*H05B 33/00* (2006.01)

(52) U.S. Cl. ........ 313/110; 313/504; 313/506; 313/112; 313/113

(58) Field of Classification Search ........... 313/504–506
See application file for complete search history.

(56) References Cited

U.S. PATENT DOCUMENTS

| | | | |
|---|---|---|---|
| 6,118,504 A | 9/2000 | Iijima et al. | |
| 6,169,708 B1 | 1/2001 | Kaneko et al. | |
| 6,297,864 B1 | 10/2001 | Kaneko et al. | |
| 6,624,936 B2 * | 9/2003 | Kotchick et al. | 359/485.03 |
| 6,774,962 B2 | 8/2004 | Yoon | |
| 6,787,976 B2 | 9/2004 | Minoura et al. | |
| 6,841,803 B2 | 1/2005 | Aizawa et al. | |
| 6,898,018 B2 | 5/2005 | Minoura et al. | |
| 2002/0043931 A1 | 4/2002 | Minoura et al. | |

(Continued)

FOREIGN PATENT DOCUMENTS

EP    0588504 A1    3/1994

(Continued)

OTHER PUBLICATIONS

European search report for European patent application No. 09166447.4-2203 dated Nov. 24, 2009 by European Patent Office.

(Continued)

*Primary Examiner* — Sikha Roy
(74) *Attorney, Agent, or Firm* — Knobbe Martens Olson & Bear LLP (57) ABSTRACT

An organic light emitting diode (OLED) display device is disclosed. In one embodiment, the OLED device includes 1) an organic light emitting element configured to emit light, 2) a cholesteric liquid crystal (CLC) layer formed over the organic light emitting element and configured to selectively transmit or reflect circularly polarized light and 3) a translucent metal layer formed on the CLC layer and configured to partially transmit and partially reflect incoming light. According to at least one embodiment, the OLED can suppress reflection of external light while minimizing loss of light generated from the organic emission layer.

20 Claims, 4 Drawing Sheets

U.S. PATENT DOCUMENTS

| | | | |
|---|---|---|---|
| 2002/0122235 A1* | 9/2002 | Kurtz et al. | 359/254 |
| 2003/0127656 A1 | 7/2003 | Aizawa et al. | |
| 2004/0051445 A1 | 3/2004 | Adachi | |
| 2004/0189167 A1 | 9/2004 | Adachi et al. | |
| 2006/0145600 A1 | 7/2006 | Yu et al. | |
| 2006/0187384 A1* | 8/2006 | Hisatake | 349/113 |
| 2007/0024777 A1 | 2/2007 | Sawayama et al. | |
| 2007/0085476 A1 | 4/2007 | Hirakata et al. | |
| 2007/0145889 A1 | 6/2007 | Tamura et al. | |
| 2007/0230211 A1 | 10/2007 | Osato et al. | |
| 2008/0123321 A1 | 5/2008 | Hsu et al. | |
| 2008/0144177 A1 | 6/2008 | Miller | |
| 2009/0290079 A1* | 11/2009 | Evans et al. | 349/18 |

FOREIGN PATENT DOCUMENTS

| | | |
|---|---|---|
| EP | 0969296 A2 | 1/2000 |
| GB | 2437553 A | 10/2007 |
| JP | 06-109925 A | 4/1994 |
| JP | 06-235914 | 8/1994 |
| JP | 2001-357979 | 12/2001 |
| JP | 2002-198184 | 7/2002 |
| JP | 2003-121835 | 4/2003 |
| JP | 2003-186413 | 7/2003 |
| JP | 2003-186413 A | 7/2003 |
| JP | 2003-315548 A | 11/2003 |
| JP | 2004-030955 A | 1/2004 |
| JP | 2004-070094 A | 3/2004 |
| JP | 2004-086145 | 3/2004 |
| JP | 2004-219825 A | 8/2004 |
| JP | 2004-296162 | 10/2004 |
| JP | 2004-296162 A | 10/2004 |
| JP | 2004-361774 A | 12/2004 |
| JP | 2005-108540 | 4/2005 |
| JP | 2006-343553 | 12/2006 |
| JP | 2006-343553 A | 12/2006 |
| KR | 10-2002-0003428 A | 1/2002 |
| KR | 2003-0038037 | 5/2003 |
| KR | 10-2003-0077402 A | 10/2003 |
| KR | 10-0454748 | 10/2004 |
| KR | 10-2005-0018401 A | 2/2005 |
| KR | 10-2005-0020332 A | 3/2005 |
| KR | 10-2005-0026863 A | 3/2005 |
| KR | 10-2005-0071387 A | 7/2005 |
| KR | 10-2005-0106004 A | 11/2005 |
| KR | 10-2006-0065729 A | 6/2006 |
| KR | 10-0606778 | 8/2006 |
| KR | 10-0706730 | 4/2007 |
| KR | 10-0714015 | 4/2007 |
| KR | 10-2007-0095826 A | 10/2007 |
| KR | 10-2008-0061791 A | 7/2008 |
| KR | 10-2008-0076384 A | 8/2008 |

OTHER PUBLICATIONS

European search report for European patent application No. 09166444.1-1235 dated Nov. 23, 2009 by European Patent Office.

The Extended European Search Report for European patent application No. 09168087.6-2203 dated Dec. 2, 2009 by European Patent Office.

Office Action dated Apr. 4, 2011 in related U.S. Appl. No. 12/508,409, filed Jul. 23, 2009.

* cited by examiner

ORGANIC LIGHT EMITTING DIODE DISPLAY FOR SUPPRESSING REFLECTION OF EXTERNAL LIGHT

CROSS-REFERENCE TO RELATED APPLICATION

This application claims priority under 35 U.S.C. §119(e) from provisional application No. 61/083,866 filed on Jul. 25, 2008, which is incorporated herein by reference in its entirety.

This application relates to 1) U.S. patent application entitled "ORGANIC LIGHT EMITTING DIODE DISPLAY" and 2) U.S. patent application entitled "ORGANIC LIGHT EMITTING DIODE DISPLAY", which are concurrently filed with this application and incorporated herein by reference in their entirety.

BACKGROUND OF THE INVENTION

1. Field of the Invention

The present invention relates to an organic light emitting diode (OLED) display. More particularly, it relates to an OLED display with improved display characteristics.

2. Description of the Related Technology

An organic light emitting diode (OLED) display includes a plurality of OLEDs each having a hole injection electrode, an organic emission layer, and an electron injection electrode. When the anode and cathode inject holes and electrons into the organic light emitting layer, the OLEDs emit light using energy generated when excitons generated by electron-hole combinations in the organic light emitting layer are dropped from an excitation state to a ground state, and an image is displayed when the excitons are dropped from an excited state to a ground state.

Therefore, the OLED display has self-luminance characteristics and the thickness and weight of the OLED display can be reduced since it does not require a separate light source, unlike a liquid crystal display (LCD). In addition, since the OLED display exhibits high-quality characteristics such as low power consumption, high luminance, a high response speed, etc., it is receiving much attention as a next-generation display device.

SUMMARY OF CERTAIN INVENTIVE ASPECTS

One aspect of the present invention is an OLED display that can suppress reflection of external light while minimizing loss of light generated from an organic emission layer.

Another aspect of the invention is an OLED display, which includes a first electrode, an organic emission layer formed on the first electrode, a second electrode formed on the organic emission layer, a CLC layer formed on the second electrode, a translucent metal layer formed on the CLC layer, a retardation plate formed on the translucent metal layer, and a polarizing plate formed on the retardation plate.

Another aspect of the invention is an organic light emitting diode (OLED) display device, comprising: a first substrate; an organic light emitting element formed over the first substrate, wherein the organic light emitting element comprise i) first and second electrodes and ii) an organic emission layer interposed between the first and second electrodes; a driving circuit formed over the substrate and configured to drive the organic light emitting element; a cholesteric liquid crystal (CLC) layer formed over the organic light emitting element and configured to selectively transmit or reflect circularly polarized light; a translucent metal layer formed on the CLC layer and configured to partially transmit and partially reflect incoming light; a retardation plate formed on the translucent metal layer and configured to input one of i) linearly polarized light and ii) circularly polarized light, and output the other light; and a polarizing plate formed on the retardation plate and configured to transmit a portion of incoming light that matches a polarizing axis of the polarizing plate, and absorb the remaining incoming light that does not match the polarizing axis thereof.

The above OLED display device further comprises a second substrate formed on the polarizing plate. The above OLED display device further comprises a second substrate formed between the CLC layer and the organic light emitting element. The above OLED display device further comprises an adhesive layer interposed between the second electrode and the CLC layer.

Another aspect of the invention is an organic light emitting diode (OLED) display device, comprising: a polarizing plate configured to input external light and output first linearly polarized light; a retardation plate configured to convert the first linearly polarized light into first circularly polarized light; a translucent layer configured to transmit a portion of the first circularly polarized light and reflect the remaining polarized light into a second circularly polarized light toward the retardation plate, wherein the second circularly polarized light is 180 degrees different in phase from the first circularly polarized light; a cholesteric liquid crystal (CLC) layer configured to transmit the portion of the first circularly polarized light; and an electrode configured to reflect the portion of the first circularly polarized light toward the CLC layer, wherein the electrode is formed on an organic emission layer, wherein the retardation plate is further configured to convert the second circularly polarized light into a second linearly polarized light, and wherein the polarizing plate is further configured to absorb the second linearly polarized light.

In the above OLED display device, the translucent layer is formed of metal. In the above OLED display device, the translucent layer has a thickness about 300 Å. In the above OLED display device, the electrode is configured to reflect the second circularly polarized light into a third circularly polarized light which is the same in phase as the first circularly polarized light, wherein the CLC layer is further configured to transmit the third circularly polarized light, and wherein the translucent layer is further configured to transmit a portion of the third circularly polarized light and reflect the remaining portion of the third circularly polarized light toward the CLC layer.

The above OLED display device further comprises a driving circuit configured to drive the organic emission layer so as to emit light. The above OLED display device further comprises an adhesive layer interposed between the electrode and the CLC layer.

Another aspect of the invention is an organic light emitting diode (OLED) display device, comprising: an organic emission layer configured to emit light; an electrode formed on the organic emission layer and configured to transmit the emitted light, wherein the emitted light comprises i) first circularly polarized light and ii) second circularly polarized light which are 180 degrees different in phase from each other; a cholesteric liquid crystal (CLC) layer configured to transmit the first circularly polarized light and reflect the second circularly polarized light into a third circularly polarized light toward the electrode; a translucent layer configured to transmit a portion of the first circularly polarized light output from the CLC layer and reflect the remaining first circularly polarized light toward the CLC layer; a retardation plate configured to convert the portion of the first circularly polarized light output from the CLC layer into first linearly polarized light; and a polarizing plate configured to transmit the first linearly polarized light.

In the above OLED display device, the translucent layer is formed of metal. In the above OLED display device, the thickness of the translucent layer is about twice the skin depth, wherein the skin depth denotes an index that indicates how deeply a signal flows into the translucent layer according to a frequency. The above OLED display device further comprises an adhesive layer interposed between the electrode and the CLC layer. In the above OLED display device, the electrode is further configured to reflect the third circularly polarized light into a fourth circularly polarized light which is the same in phase as the second circularly polarized light, wherein the CLC layer is further configured to transmit the fourth circularly polarized light, and wherein the translucent layer is further configured to transmit a portion of the fourth circularly polarized light and reflect the remaining portion of the fourth circularly polarized light toward the CLC layer. The above OLED display device further comprises a substrate formed between the CLC layer and the electrode.

Another aspect of the invention is an organic light emitting diode (OLED) display device, comprising: a substrate; an organic light emitting element formed over the substrate, wherein the organic light emitting element comprise i) first and second electrodes and ii) an organic emission layer interposed between the first and second electrodes; a cholesteric liquid crystal (CLC) layer formed over the organic light emitting element and configured to selectively transmit or reflect circularly polarized light; means for partially transmitting and partially reflecting incident light; a retardation plate formed on the means and configured to input one of i) linearly polarized light and ii) circularly polarized light, and output the other light; and a polarizing plate formed on the retardation plate and configured to transmit a portion of incoming light that matches a polarizing axis of the polarizing plate, and absorb the remaining incoming light that does not match the polarizing axis thereof.

In the above OLED display device, the means comprises a translucent metal layer. In the above OLED display device, the amount and ratio of the transmitted light and the amount and ratio of the reflected light are controlled by adjusting the thickness of the means.

Still another aspect of the invention is an organic light emitting diode (OLED) display device, comprising: an organic light emitting element configured to emit light; a cholesteric liquid crystal (CLC) layer formed over the organic light emitting element and configured to selectively transmit or reflect circularly polarized light; and a translucent metal layer formed on the CLC layer and configured to partially transmit and partially reflect incoming light.

DETAILED DESCRIPTION OF CERTAIN INVENTIVE EMBODIMENTS

In general, at least one of the hole injection electrode and the electron injection electrode of the OLED display can reflect light generated from an organic light emission layer as well as from an external source.

Therefore, the OLED display has problems in that expression of a black color and contrast can be deteriorated due to reflection of external light when the OLED display is used in a bright place.

In order to solve the problems, a polarizing plate and a retardation plate are disposed for suppressing reflection of the external light. However, when the external light is suppressed by the polarizing plate and the retardation plate, a large amount of light generated from the organic emission layer can also be lost.

Embodiments of the present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

In addition, the size and thickness of each configuration shown in the drawings are not limited thereto.

In order to describe embodiments of the present invention more clearly, parts that are not related to the description will be omitted from the drawings, and the same symbols will be given to similar parts throughout the specification. In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
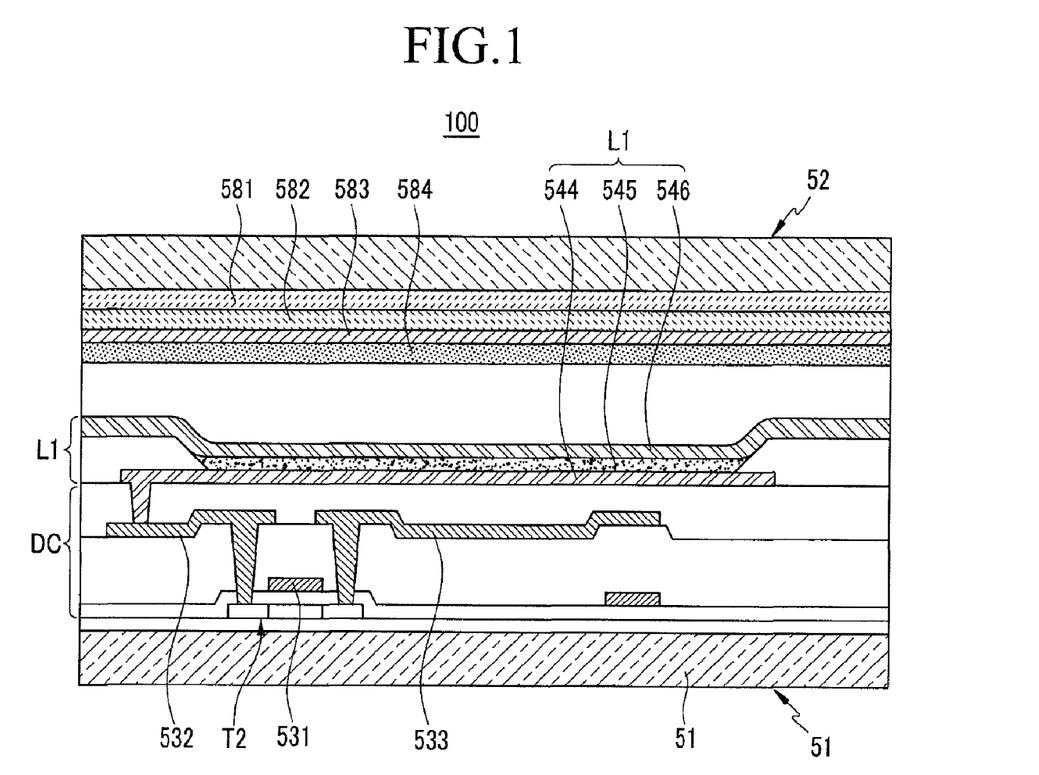
FIG. 1 is a partial cross-sectional view of an organic light emitting diode (OLED) display according to an exemplary embodiment of the present invention.

As shown in FIG. 1, an organic light emitting diode (OLED) display 100 according to an exemplary embodiment of the present invention includes a driving circuit (DC), an organic light emitting element L1, a cholesteric liquid crystal (CLC) layer 584, a translucent metal layer 583, a retardation plate 582, and a polarizing plate 581.

The CLC layer 584, the translucent metal layer 583, the retardation plate 582, and the polarizing plate 581 are substantially disposed on the organic light emitting element L1.

The DC and the organic light emitting element L1 may be formed on a first substrate 51. In one embodiment, the first substrate 51 includes a substrate member 511, the DC formed on the substrate member 511, and the organic light emitting element L1 formed on the DC.

Figure 2:
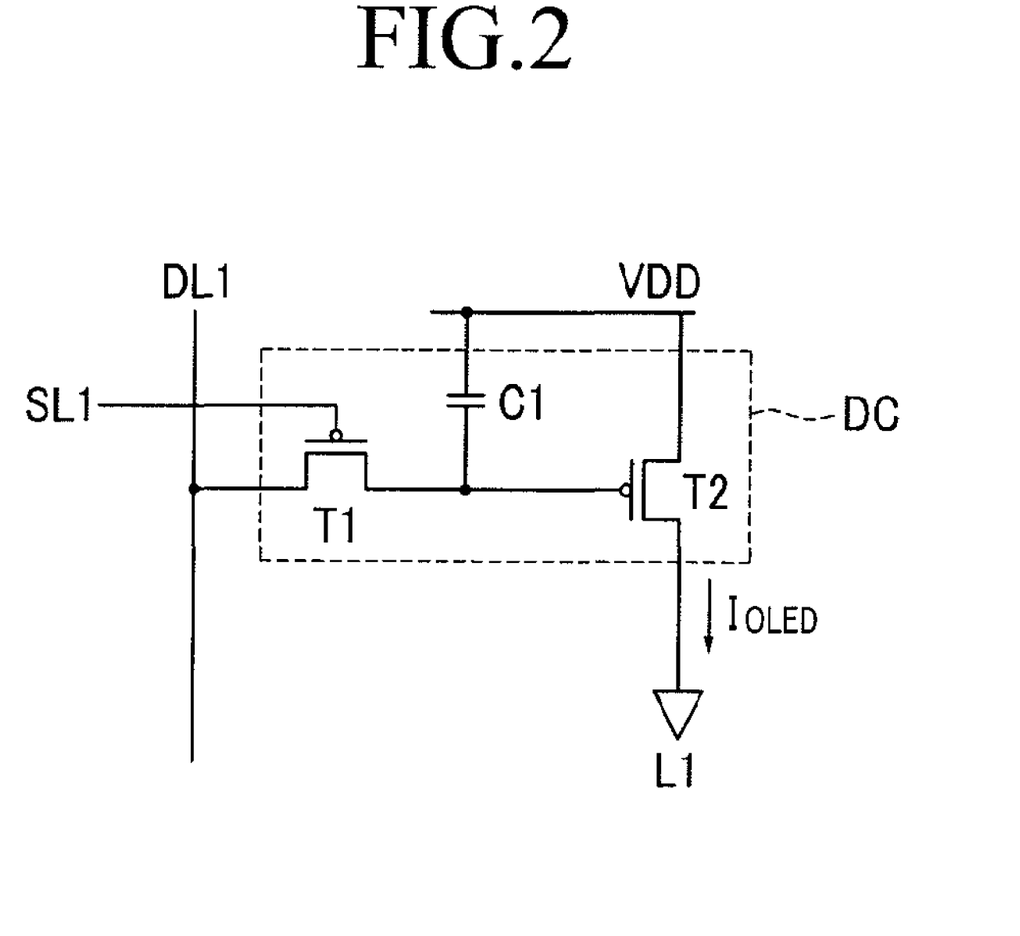
FIG. 2 is a layout view of a driving circuit unit and an organic light emitting element of the OLED display of FIG. 1.

In one embodiment, the DC has a circuit structure of FIG. 2. As shown in FIG. 2, the DC may include at least two thin film transistors (TFTs) T1 and T2 and at least one storage capacitor C1. The TFT basically includes a switching transistor T1 and a driving transistor T2.

The switching transistor T1 is connected to a scan line SL1 and a data line DL1, and the scan line SL1 transmits a data voltage to the driving transistor T2. Here, the data voltage is input to the data line DL1 according to a switching voltage input to the scan line SL1. The storage capacitor C1 is connected to the switching transistor T1 and a power source line VDD, and stores a voltage difference of a voltage transmitted from the switching transistor T1 and a voltage supplied to the power source line VDD.

The driving transistor T2 is connected to the power source line VDD and the storage capacitor C1 and supplies an output current $I_{OELD}$, which corresponds to a square of a difference between a voltage stored in the storage capacitor C1 and a threshold voltage, to the organic light emitting element L1, and the organic light emitting element L1 emits light by the output current $I_{OLED}$. Referring back to FIG. 1, the driving transistor T2 includes a source electrode 533, a drain electrode 532, and a gate electrode 531.

In one embodiment, the organic light emitting element L1 includes a first electrode 544, an organic emission layer 545 formed on the first electrode 544, and a second electrode 546 formed on the organic emission layer 545. In one embodiment, the first electrode 544 is an anode and the second electrode 546 is a cathode. In another embodiment, the first electrode 544 may be a cathode and the second electrode 546 may be an anode.

The first electrode 544 of the organic light emitting element L1 is connected to the drain electrode 532 of the driving transistor T2.

Configurations of the DC and the organic light emitting element L1 are not limited to the above-described configurations, and can be variously changed with a disclosed configuration that can be easily realized by a person skilled in the art.

The CLC layer 584 may be formed on the second electrode 546 of the organic light emitting element L1.

In one embodiment, CLC has a layered structure like a smectic liquid crystal, but molecules of a longitudinal axis are arranged in parallel like a nematic liquid crystal. In one embodiment, thin and long molecules are arranged in substantially parallel in a longitudinal direction in one plane and move to a direction that is substantially perpendicular to the corresponding surface so that the alignment direction of the molecule axis has a structure that is curved in a helical shape. Therefore, the entire liquid crystal layer may have a helical structure. Accordingly, the CLC may have characteristics such as optical rotary power, selective light scattering, circular polarization, and dichroism.

Therefore, the CLC layer 584 can selectively transmit or reflect circularly polarized light. For example, the CLC layer 584 can transmit right circularly polarized light and reflect left circularly polarized light.

The translucent metal layer 583 partially transmits light and partially reflects light. The amount and ratio of transmitted light and the amount and ratio of reflected light can be controlled by adjusting the thickness of the translucent metal layer 583. In one embodiment, the translucent metal layer 583 typically has a thickness of less than about 300 Å, and the thickness is about 2 times the skin depth. The skin depth denotes an index that indicates how deeply a signal flows from the surface according to a frequency, and it is changed in accordance with conductivity of a metal layer.

The retardation plate 582 changes the phase of the transmitted light. In one embodiment, a ¼ wavelength plate is used as the retardation plate 582, and linear polarization is changed to circular polarization by the retardation plate 582.

The polarizing plate 581 performs linear polarization on light. In one embodiment, the polarizing plate 581 transmits light that matches a polarizing axis of the polarizing plate 581, and absorbs light that does not match the polarizing axis. That is, when the light passes through the polarizing plate 581, the light is linearly polarized toward the polarizing axis of the polarizing plate 581. In addition, luminance is reduced as much as the amount of light lost by the polarizing plate 581.

In one embodiment, the linearly polarized light formed through the polarizing plate 581 passes through the retardation plate 582 again, and the linearly polarized light becomes circularly polarized light to the right side (hereinafter referred to as right-circularly polarized) due to alignment of the polarizing plate 581 and the retardation plate 582.

On the other hand, when the right-circularly polarized light is passed through the retardation plate 582, it becomes linearly polarized light in the same (or substantially the same) direction as the polarizing axis of the polarizing plate 581. That is, the right-circularly polarized light becomes the linearly polarized light through the retardation plate 582, and this linearly polarized light can pass through the polarizing plate 581.

However, when the left-circularly polarized light passes through the retardation plate 582, it becomes the linearly polarized light in a direction that crosses the polarizing axis of the polarizing plate 581. This linearly polarized light cannot be passed the polarization plate 581 and it is absorbed.

In one embodiment, the CLC layer 584 passes circularly polarized light that is in the same (or substantially the same) direction as the circularly polarized light that is formed by being sequentially passed through the polarizing plate 581 and the retardation plate 582, and reflects circularly polarized light of a different direction. In one embodiment, the CLC layer 584 passes the right-circularly polarized light and reflects the left-circularly polarized light. However, the present invention is not limited thereto. The CLC layer 584 may pass the left-circularly polarized light and reflect the right-circularly polarized light, and lateral sides of the CLC layer 584 can respectively and selectively transmit or reflect light.

A second substrate 52 covers the first substrate 51 where the organic light emitting element L1 and the DC are formed. In addition, the second substrate 52 also covers the CLC layer 584, the translucent metal layer 583, the retardation plate 582, and the polarizing plate 581 that are sequentially formed on the organic light emitting element L1. However, the present invention is not limited thereto. The CLC layer 584, the translucent metal layer 583, the retardation plate 582, and the polarizing plate 581 may be formed on the second substrate 52.

Although it is not shown in the drawings, the OLED display 100 may further include an adhesive layer interposed between the second electrode 546 and the CLC layer 584 on the organic light emitting element L1.

With this configuration, the OLED display 100 can effectively suppress external light reflection and minimize light loss when light generated from the organic emission layer (545 of FIG. 1) is emitted to the outside.

In addition, the OLED display 100 can improve black color expression and contrast. That is, display characteristics of the OLED display 100 can be improved.

In addition, the OLED display 100 can have a mirror effect by the translucent metal layer 583 when the organic emission layer 545 does not emit light.

Further, the OLED display 100 can have reduced power consumption and an increased life-span.

Figure 3:
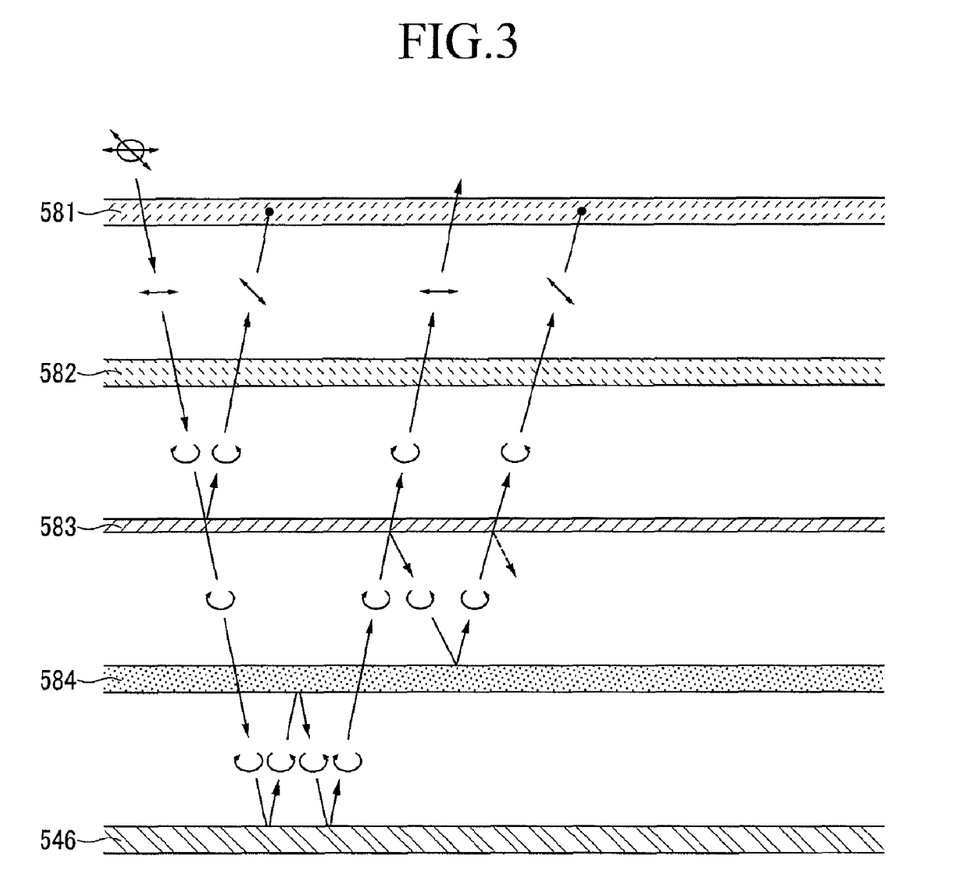
FIG. 3 is a cross-sectional view of a path of light transmitted from the outside to the OLED display of FIG. 1.

Hereinafter, external light suppression in the OLED display 100 will be described with reference to FIG. 3.

First, the external light passes through the polarizing plate 581 and becomes linearly polarized, and the linearly polarized light passes through the retardation plate 582 and becomes right-circularly polarized light. The right-circularly polarized light partially passes through the translucent metal layer 583, and the rest of the right-circularly polarized light that has not passed through the translucent metal layer 583 is reflected by the translucent metal layer 583 and moves toward the retardation plate 582. Here, when the right-circularly polarized light is reflected to the translucent metal layer 583, the phase of the right-circularly polarized light is twisted by 180 degrees (or about 180 degrees) so that it is changed to left-circularly polarized light.

The light reflected to the translucent metal layer 583 and changed to the left-circularly polarized light passes through the retardation plate 582 and becomes linearly polarized light in a direction that crosses the polarizing axis of the polarizing plate 581 so that it is absorbed.

Therefore, the OLED display 100 suppresses reflection of external light by as much as the amount of external light that is primarily reflected by the translucent metal layer 583.

The right-circularly polarized light having passed through the translucent metal layer 583 passes through the CLC layer 584, and is then reflected by the second electrode (546 of FIG. 1) or the first electrode (544 of FIG. 1) of the organic light emitting element (L1 of FIG. 1). In this instance, the right-circularly polarized light is changed to left-circularly polarized light and moves back to the CLC layer 584. The left-circularly polarized light is reflected by the CLC layer 584 and moves back to the second electrode 546. At this time, the phase of the left-circularly polarized light is not changed. The left-circularly polarized light is iteratively reflected by the second electrode 546 or the first electrode 544 and changed back to the right-circularly polarized light. After passing through the CLC layer 584, a part of the right-circularly polarized light is reflected by the translucent metal layer 583 and moves back to the CLC layer 584, and another part of the right-circularly polarized light passes through the translucent metal layer 583. Light reflected by the translucent metal layer 583 is gradually eliminated by repeating reflection and phase shift.

Therefore, the OLED display 100 can suppress external light by as much as the amount of light that is secondarily reflected by the translucent metal layer 583. The right-circularly polarized light having passed through the translucent metal layer 583 passes through the retardation plate 582 and is changed to linearly polarized light, and the linearly polarized light is emitted outside through the polarizing plate 581.

As described, the OLED display 100 eliminates a large amount of external light by repeating reflecting and phase shift through the translucent metal layer 583 and the CLC layer 584 so that a part of the external light is reflected and emitted outside.

Therefore, the OLED display 100 can effectively suppress external light reflection and prevent deterioration of image quality.

Figure 4:
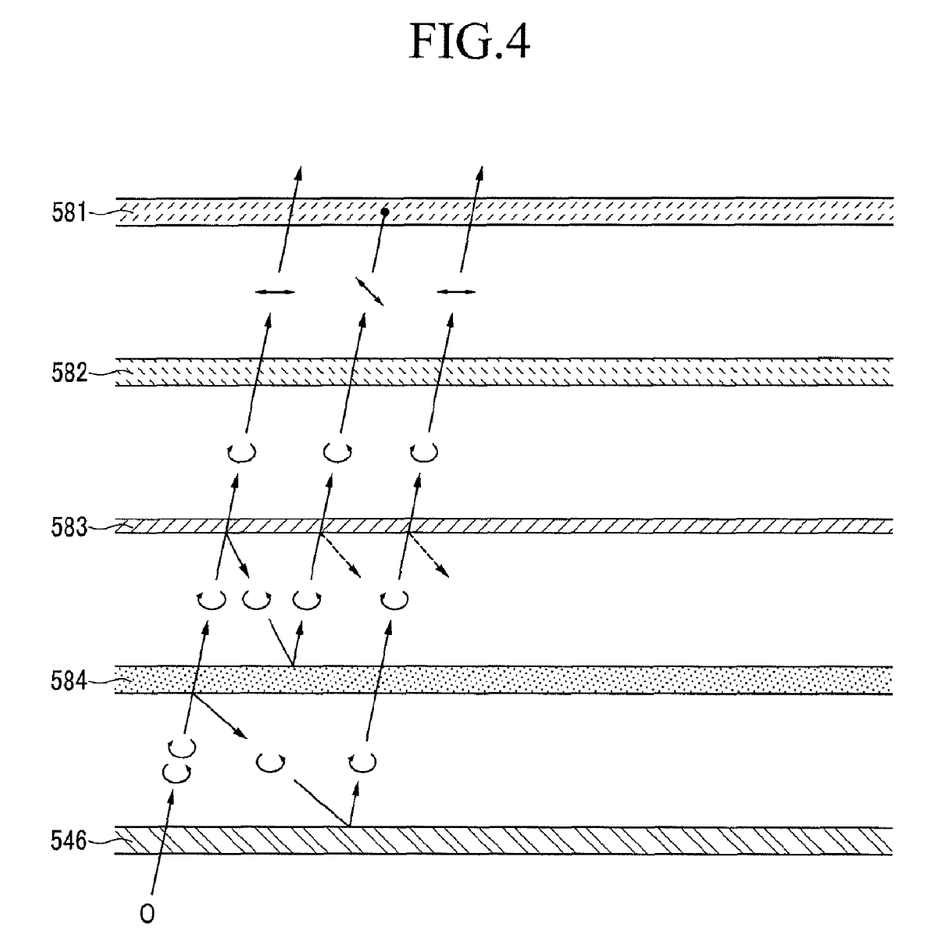
FIG. 4 is a cross-sectional view of a path of light generated from the organic light emitting element of FIG. 1 to the outside.

Hereinafter, a process in which light generated from the organic light emitting element L1 of the OLED display 100 is emitted outside will be described with reference to FIG. 4.

First, light generated from the organic emission layer (545 of FIG. 1) passes through the second electrode 546 and moves to the CLC layer 584. At this time, the light includes right-circularly polarized light and left-circularly polarized light, and the right-circularly polarized light passes through the CLC layer 584 and the left-circularly polarized light is reflected by the CLC layer 584 and moves back to the second electrode 546.

A part of the right-circularly polarized light passed through the CLC layer 584 is reflected by the translucent metal layer 583 and moves to the CLC layer 584, and the other part of the right-circularly polarized light passes through the translucent metal layer 583.

The right-circularly polarized light having passed through the translucent metal layer 583 passes through the retardation plate 582 and becomes linearly polarized light, and the linearly polarized light passes through the polarizing plate 581 and is emitted outside. Oh the other hand, the right-circularly polarized light reflected by the translucent metal layer 583 is changed to left-circularly polarized light and reflected by the CLC layer 584 again.

A part of the left-circularly polarized light that is reflected by the CLC layer 584 again becomes linearly polarized light in a direction that crosses the polarizing axis of the polarizing plate 582 while passing through the translucent metal layer 583 and the retardation plate 582, and the linearly polarized light is absorbed. In addition, the other part of the left-circularly polarized light that is reflected by the CLC layer 584 again is reflected by the translucent metal layer 583 again, and is gradually eliminated by repeating reflection and phase shift.

Left-circularly polarized light that is generated from the organic emission layer 545, passes through the second electrode 546, and moves to the CLC layer 584 is changed to right-circularly polarized light while being reflected by the CLC layer 584 and is reflected by the second electrode 546 or the first electrode 544 again and passes through the CLC layer 584. The next process is the same or substantially the same as that described above.

According to at least one embodiment, the organic emission layer 545 can minimize light loss in the process of emitting light generated from the organic emission layer 545 to the outside. In addition, the OLED display 100 can provide a mirror effect by the translucent metal layer 583 when the organic emission layer 545 does not emit light.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a first substrate;
   an organic light emitting element formed over the first substrate, wherein the organic light emitting element comprise i) first and second electrodes and ii) an organic emission layer interposed between the first and second electrodes;
   a driving circuit formed over the substrate and configured to drive the organic light emitting element;
   a cholesteric liquid crystal (CLC) layer formed over the organic light emitting element and configured to selectively transmit or reflect circularly polarized light;
   a translucent metal layer formed on the CLC layer and configured to partially transmit and partially reflect incoming light;
   a retardation plate formed on the translucent metal layer and configured to input one of i) linearly polarized light and ii) circularly polarized light, and output the other light; and
   a polarizing plate formed on the retardation plate and configured to transmit a portion of incoming light that matches a polarizing axis of the polarizing plate, and absorb the remaining incoming light that does not match the polarizing axis thereof.

2. The OLED display device of claim 1, further comprising a second substrate formed on the polarizing plate.

3. The OLED display device of claim 1, further comprising a second substrate formed between the CLC layer and the organic light emitting element.

4. The OLED display device of claim 1, further comprising an adhesive layer interposed between the second electrode and the CLC layer.

5. An organic light emitting diode (OLED) display device, comprising:

a polarizing plate configured to input external light and output first linearly polarized light;

a retardation plate configured to convert the first linearly polarized light into first circularly polarized light;

a translucent layer configured to transmit a portion of the first circularly polarized light and reflect the remaining polarized light into a second circularly polarized light toward the retardation plate, wherein the second circularly polarized light is 180 degrees different in phase from the first circularly polarized light;

a cholesteric liquid crystal (CLC) layer configured to transmit the portion of the first circularly polarized light; and an electrode configured to reflect the portion of the first circularly polarized light toward the CLC layer, wherein the electrode is formed on an organic emission layer, wherein the retardation plate is further configured to convert the second circularly polarized light into a second linearly polarized light, and wherein the polarizing plate is further configured to absorb the second linearly polarized light.

6. The OLED display device of claim 5, wherein the translucent layer is formed of metal.

7. The OLED display device of claim 5, wherein the translucent layer has a thickness of about 300 Å.

8. The OLED display device of claim 5, wherein the electrode is configured to reflect the second circularly polarized light into a third circularly polarized light which is the same in phase as the first circularly polarized light, wherein the CLC layer is further configured to transmit the third circularly polarized light, and wherein the translucent layer is further configured to transmit a portion of the third circularly polarized light and reflect the remaining portion of the third circularly polarized light toward the CLC layer.

9. The OLED display device of claim 5, further comprising a driving circuit configured to drive the organic emission layer so as to emit light.

10. The OLED display device of claim 5, further comprising an adhesive layer interposed between the electrode and the CLC layer.

11. An organic light emitting diode (OLED) display device, comprising:

an organic emission layer configured to emit light;

an electrode formed on the organic emission layer and configured to transmit the emitted light, wherein the emitted light comprises i) first circularly polarized light and ii) second circularly polarized light which are 180 degrees different in phase from each other;

a cholesteric liquid crystal (CLC) layer configured to transmit the first circularly polarized light and reflect the second circularly polarized light into a third circularly polarized light toward the electrode;

a translucent layer configured to transmit a portion of the first circularly polarized light output from the CLC layer and reflect the remaining first circularly polarized light toward the CLC layer;

a retardation plate configured to convert the portion of the first circularly polarized light output from the CLC layer into first linearly polarized light; and a polarizing plate configured to transmit the first linearly polarized light.

12. The OLED display device of claim 11, wherein the translucent layer is formed of metal.

13. The OLED display device of claim 11, wherein the translucent layer has a thickness of about 300 Å.

14. The OLED display device of claim 11, further comprising an adhesive layer interposed between the electrode and the CLC layer.

15. The OLED display device of claim 11, wherein the electrode is further configured to reflect the third circularly polarized light into a fourth circularly polarized light which is the same in phase as the first circularly polarized light, wherein the CLC layer is further configured to transmit the fourth circularly polarized light, and wherein the translucent layer is further configured to transmit a portion of the fourth circularly polarized light and reflect the remaining portion of the fourth circularly polarized light toward the CLC layer.

16. The OLED display device of claim 11, further comprising a substrate formed between the CLC layer and the electrode.

17. An organic light emitting diode (OLED) display device, comprising:

a substrate;

an organic light emitting element formed over the substrate, wherein the organic light emitting element comprise i) first and second electrodes and ii) an organic emission layer interposed between the first and second electrodes;

a cholesteric liquid crystal (CLC) layer formed over the organic light emitting element and configured to selectively transmit or reflect circularly polarized light;

means for partially transmitting and partially reflecting incident light;

a retardation plate formed on the means and configured to input one of i) linearly polarized light and ii) circularly polarized light, and output the other light; and a polarizing plate formed on the retardation plate and configured to transmit a portion of incoming light that matches a polarizing axis of the polarizing plate, and absorb the remaining incoming light that does not match the polarizing axis thereof.

18. The OLED display device of claim 17, wherein the means comprises a translucent metal layer.

19. The OLED display device of claim 17, wherein the amount and ratio of the transmitted light and the amount and ratio of the reflected light are controlled by adjusting the thickness of the means.

20. An organic light emitting diode (OLED) display device, comprising:

an organic light emitting element configured to emit light;

a cholesteric liquid crystal (CLC) layer formed over the organic light emitting element and configured to selectively transmit or reflect circularly polarized light; and a translucent metal layer formed on the CLC layer and configured to partially transmit and partially reflect incoming light.

* * * * *